(12) United States Patent
Violette et al.

(10) Patent No.: US 6,917,083 B1
(45) Date of Patent: Jul. 12, 2005

(54) LOCAL GROUND AND $V_{CC}$ CONNECTION IN AN SRAM CELL

(75) Inventors: Michael P. Violette, Boise, ID (US); Fernando Gonzalez, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 08/508,117

(22) Filed: Jul. 27, 1995

(51) Int. Cl.[7] .......................... H01L 29/76; H01L 29/94
(52) U.S. Cl. ..................... 257/369; 257/368; 257/371; 257/903
(58) Field of Search .................. 257/368, 369, 257/371, 903

(56) References Cited

U.S. PATENT DOCUMENTS

| | | | |
|---|---|---|---|
| 4,689,871 A | 9/1987 | Malhi | 437/40 |
| 4,933,739 A | 6/1990 | Harari | 357/55 |
| 5,378,914 A * | 1/1995 | Ohzu et al. | 257/369 |

OTHER PUBLICATIONS

Wolf, S.; Tauber, R.N. *Silicon Processing for the VLSI Era*, Lattice Press, Sunset Beach, CA, 1986 pp. 280–281.

* cited by examiner

Primary Examiner—Mahshid D. Saadat
Assistant Examiner—Valencia Martin-Wallace
(74) Attorney, Agent, or Firm—Seed and Berry LLP (57) ABSTRACT

A retrograde well region, having a buried layer of high conductivity, is formed in a semiconductor substrate. A trench structure is selectively etched in the semiconductor substrate down to a region proximate to or within the buried layer. A conducting local interconnect material is formed within and proximate to the trench structure to electrically connect surface portions of the substrate to the buried layer. The buried layer is used to provide a voltage source to an integrated circuit. In one application, a P-type buried layer provides ground potential or $V_{SS}$ to a source region of an N-channel FET transistor. In a second application, an N-type buried layer provides supply potential or $V_{CC}$ to a source of a P-channel FET transistor.

13 Claims, 11 Drawing Sheets

LOCAL GROUND AND $V_{CC}$ CONNECTION IN AN SRAM CELL

TECHNICAL FIELD

This invention relates generally to integrated electronic circuits, and more particularly to forming local ground and supply voltage connections in integrated electronic circuits.

BACKGROUND OF THE INVENTION

Power must be supplied to the large number of electrical components fabricated in an integrated circuit. Typically this is done by routing one or more conductive layers throughout the circuit, and making contact through previously deposited layers to the components constructed below. One disadvantage of the prior art method of powering integrated circuits is that the deposited and etched conducting layers require extra processing steps. Extra processing steps means extra expense and an increased potential for processing errors and defects.

A second disadvantage of the commonly used power routing schemes is the consumption of significant portions of the semiconductor chip surface that otherwise could be used for active circuit fabrication. Because the circuit powering conductive layers must periodically make contact through previously deposited layers, any mask alignment errors create the potential for a missed or insufficient contact between the conductive layer and the circuit component to be powered. Also, many typically used conducting materials are poor at filling small high aspect ratio contact holes. To account for these processing tolerances and undesirable material properties, chip designers have been forced to design larger dimension contacts than necessary in principle for proper circuit performance. This is particularly disadvantageous in the design and manufacture of semiconductor memories, where the fabrication cost per bit is optimized with the smallest possible size cell that assures low sensitivity to process instabilities.

The CMOS bulk 6-T SRAM cell is just one example where traditional integrated circuit powering techniques have added significantly to the cost of fabrication. The bulk 6-T cell is superior in performance to the commonly used NMOS 4-T SRAM cell, by virtue of its better data retention, lower power consumption and faster switching speed. The bulk 6-T cell is also superior to the stacked CMOS thin-film-transistor (TFT) 6-T SRAM cell, which is subject to a number of process sensitivities and impurity problems because of the silicon deposit and recrystallization fabrication steps. Nevertheless, the large size and associated high fabrication cost of the bulk 6-T SRAM cell means it is not as frequently used as the 4-T and TFT SRAM cells.

SUMMARY OF THE INVENTION

It is an object of the present invention to provide local interconnect structures, and a method for fabricating such structures during integrated circuit processing, that provide one or more voltage supply sources to circuits through the substrate rather than overlying layers It is a further object of the present invention to provide interconnect structures, and a method for fabricating such structures, that powers a semiconductor memory cell with less consumption of cell area.

In accordance with principles of the present invention, an integrated circuit is constructed in a semiconductor substrate. The integrated circuit includes a surface region, a buried region below the surface region, and a region intermediate to the surface and buried regions. The surface and buried regions are of opposite conductivity types. The intermediate and buried regions are of the same conductivity type and the buried region has a higher conductivity. An electrical connection extends from the surface region, through the intermediate region, into the buried region, and electrically connects the surface region with the buried region. In a static random access memory device, the electrical connection extends between a common source region of two transistors and the buried region. The buried region is connected to an electric potential supply, and thereby electrically connects the common source region with the electric potential supply.

DETAILED DESCRIPTION OF THE PREFERRED EMBODIMENT

FIGS. 1–7 illustrate the main steps carried out in practicing the present invention and the structure of the present invention. While the main steps according to the present invention are shown and described herein, every single step in the entire process need not be shown. Steps that are not shown are part of the standard processing steps commonly used and known in the art.

Figure 1:
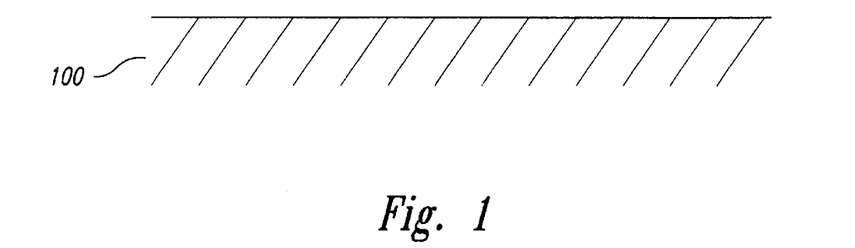
FIG. 1 is a cross-sectional view of a portion of P-type substrate upon which an integrated circuit structure according to the present invention is to be formed.
Figure 2:
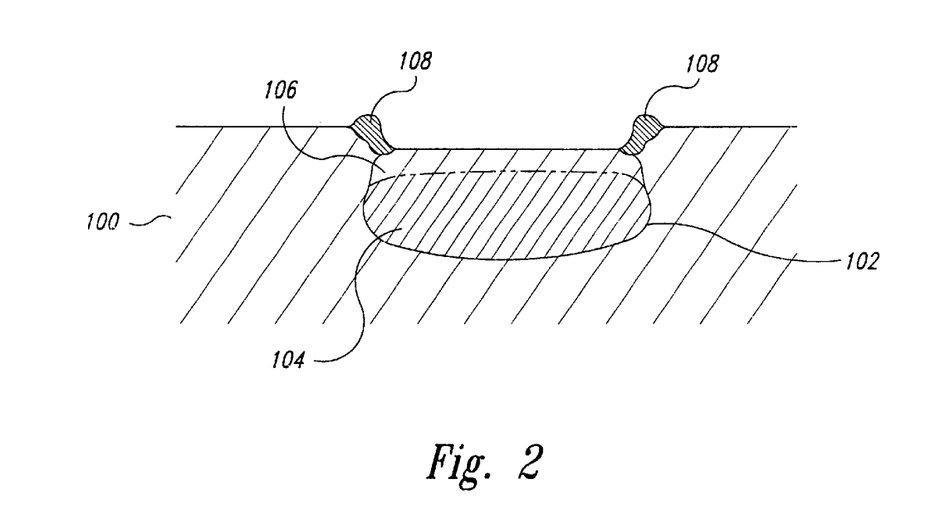
FIG. 2 shows a retrograde P-well formed according to the present invention in the substrate of FIG. 1.

FIG. 1 shows a semiconductor substrate 100 which could be substrate itself or, alternatively, an N-well or P-well, a doped epitaxial layer, or other substrate-like structure. For purposes of discussion, substrate 100 is assumed to be a doped P-type substrate. FIG. 2 shows a retrograde P-well 102 formed in the substrate 100 and isolated from other regions of the substrate by field oxide 108. The retrograde P-well 102 has a lower well or buried region 104 of approximate dopant concentration $10^{18}$–$10^{19}$/cm$^3$, and an upper well region 106 of approximate dopant concentration $10^{16}$–$10^{17}$/cm$^3$.

The preferred method of forming the retrograde P-well 102 of FIG. 2 includes the steps of forming a sacrificial oxide on the surface of the substrate 100 of FIG. 1, implanting high and low energy doses of Boron dopant, well drive, and growing field oxide to define active areas for further processing. The resulting well configuration has a retrograde dopant distribution in that the buried region 104 has a higher dopant concentration than the upper region 106. It should be noted that while buried region 104 and upper region 106 are depicted and described as being formed within well 102, these regions could instead be global to the entire substrate 100. As an alternative to the above-described high and low energy implant method, such a global retrograde structure could be formed by growing a lightly doped epitaxial layer on a heavily doped substrate, as is commonly done in bipolar and BiMOS integrated circuit fabrication.

Figure 3:
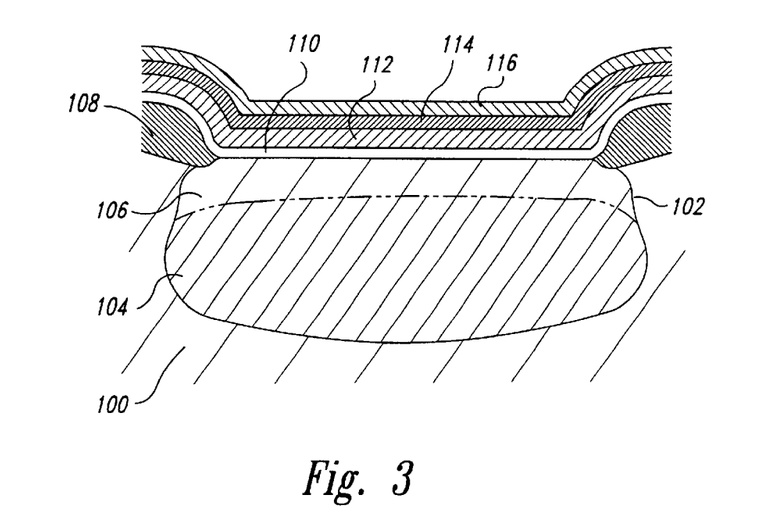
FIG. 3 is an enlarged view showing layers grown and deposited according to the present invention on the surface of the P-well of FIG. 2.

Referring to FIG. 3, a gate insulator layer or oxide 110 is grown over the surface of the well 102 after threshold adjust enhancement implantation and/or any other desired early processing steps well known to the art. Formation of the gate oxide layer 110 is followed by a deposited polycrystalline silicon layer 112, preferably negatively doped for low resistivity, and a deposited tungsten silicide or other metal silicide layer 114. Subsequently, a covering insulating layer 116 is deposited, preferably TEOS (tetro ethyl ortho silicide glass) or other acceptable isolation layer material.

Figure 4:
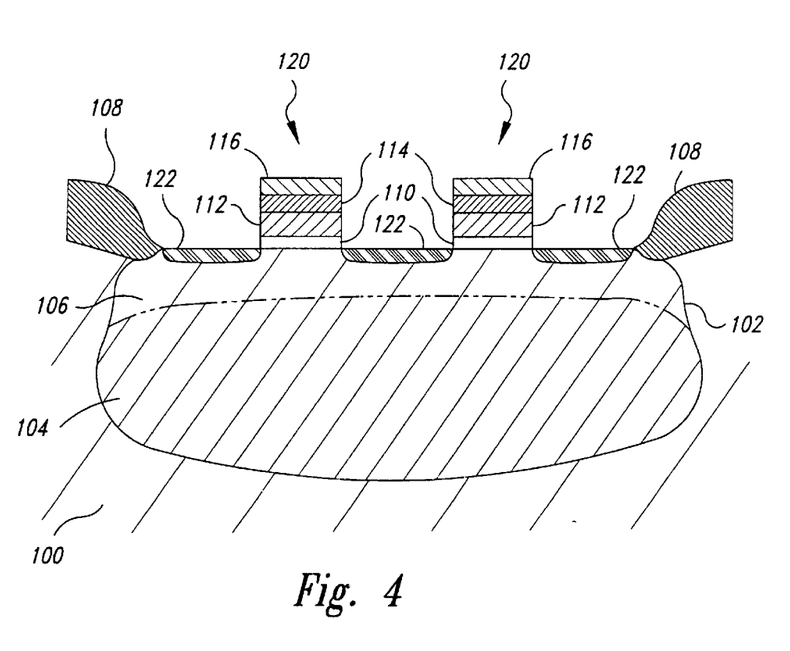
FIG. 4 shows a selective etching of the layers of FIG. 3 to form transistor gate structures, and also shows a subsequent N-type implant preparatory to configuration of lightly doped drain and source extensions.
Figure 5:
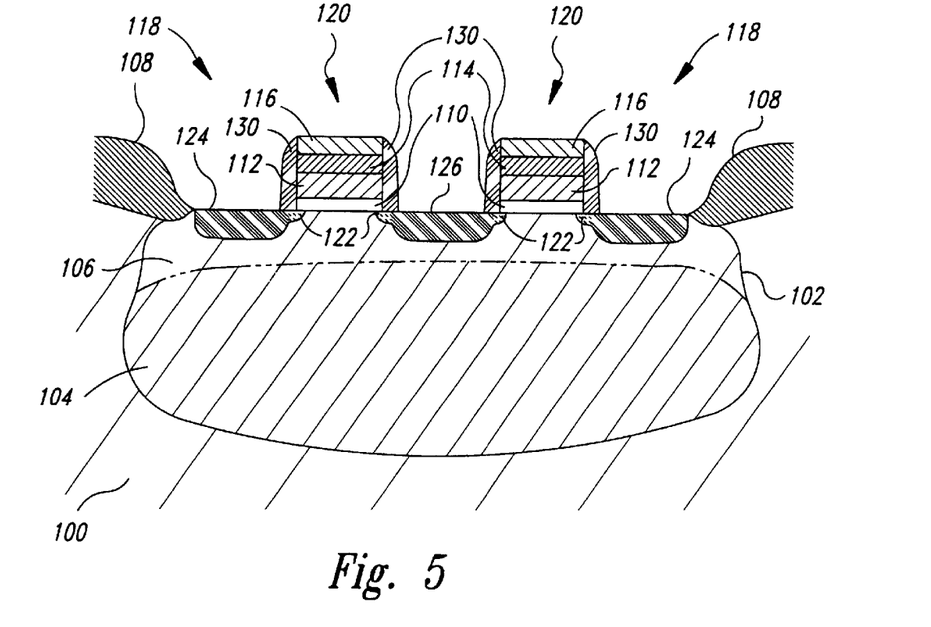
FIG. 5 shows the structure of FIG. 4 with the addition of insulating sidewall spacers and implanted drain and source regions.

Referring to FIG. 4, the surface of the well 102 is patterned and etched to form gate structures 120, and the exposed portion of the well is then subject to processing steps such as implant formation of lightly doped drain (LDD) and source extensions 122. After LDD implant and anneal, and as seen in FIG. 5, insulating sidewall spacers 130 are formed on the gate structures 120. The sidewall spacers 130 are formed by means well known to the art, such as depositing an insulating layer of nitride or oxide (LTO) by chemical vapor deposition (CVD), and subsequently selectively etching the deposited insulating layer with an anisotropic plasma etch. Heavily doped N-type drain 124 and source 126 regions are then formed within a surface region portion of the upper well region 106 by ion implantation and anneal as is well known in the art. The resulting structure depicted in FIG. 5 is of two switching devices or transistors 118, each having a control terminal or transistor gate 120 and an input/output terminal or drain 124, and both sharing a common input/output terminal or source 126.

Figure 6:
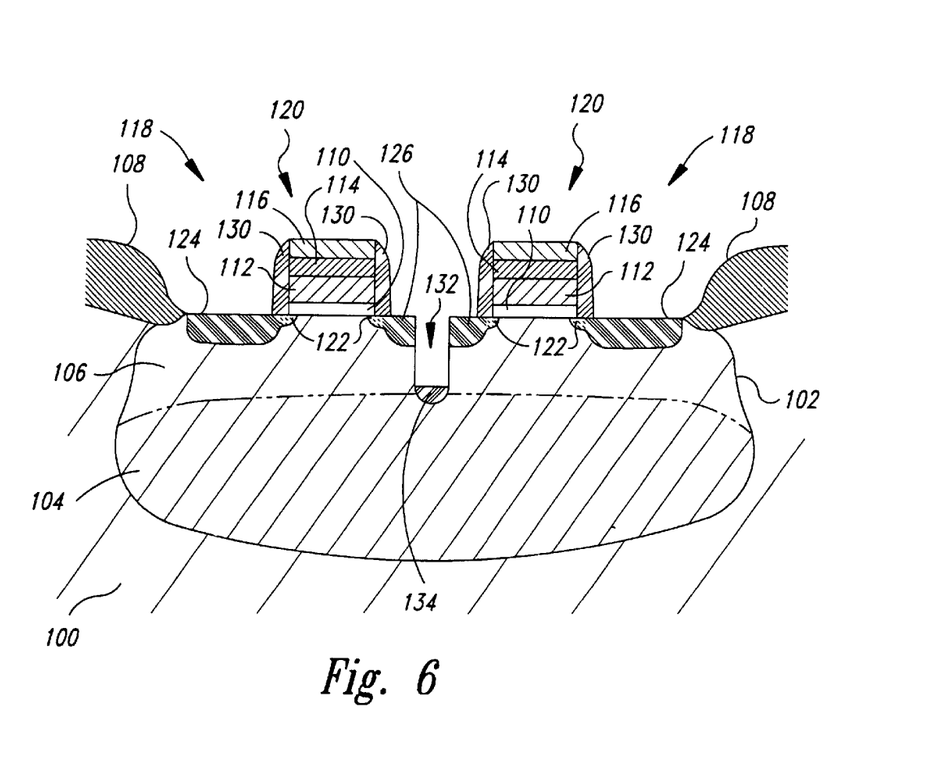
FIG. 6 shows a selective etching according to the present invention of a trench structure through the source region down to a buried region of the P-well.

Referring to FIG. 6, a selective anisotropic etch processing step is carried out to create a trench 132 through the source region 126 and an intermediate region portion of the upper well region 106 to a region proximate to the buried region 104. A heavily doped P-type region 134, preferably with concentration of the order $10^{20}$/cm$^3$, is then formed at the bottom of the trench 132 by ion implantation techniques. This heavily doped region 134 can advantageously be formed simultaneous with the formation of P-channel transistor source and drain regions on other portions (not shown) of the substrate 100, thereby saving extra processing steps. The doped region 134 forms a low resistivity interconnect region that provides an ohmic contact for a subsequently formed local interconnect (LI) or electrical conductor material 136, as shown in FIG. 7.

Figure 7:
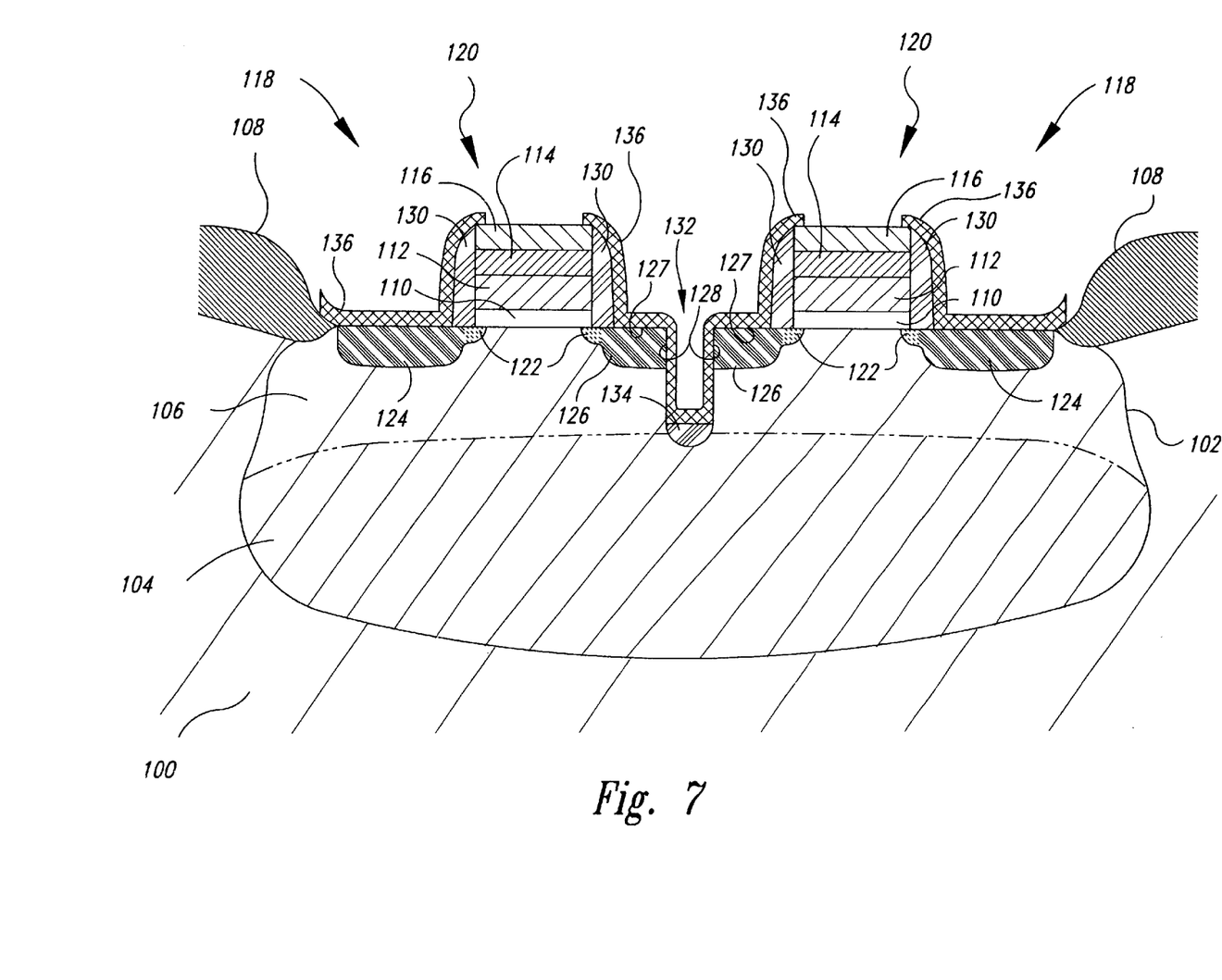
FIG. 7 shows a local interconnect layer deposited on the structure of FIG. 6 and selectively etched to electrically connect the source region with the buried region.

Referring to FIG. 7, the LI material 136 is formed and selectively etched to make electrical connections between various parts of an integrated circuit made according to the present invention. In particular, LI 136 physically extends between and electrically connects the upper surface 127 and lateral surface 128 portions of the source 126 and the doped region 134 at the bottom of the trench 132, thereby electrically connecting the source 126 with the buried region 104 of the well 102. The LI 136 can be made from any acceptable material such as tungsten, titanium, titanium nitride, a Ti/TiN sandwich, or a self-aligned metal silicide (salicide).

Figure 7A:
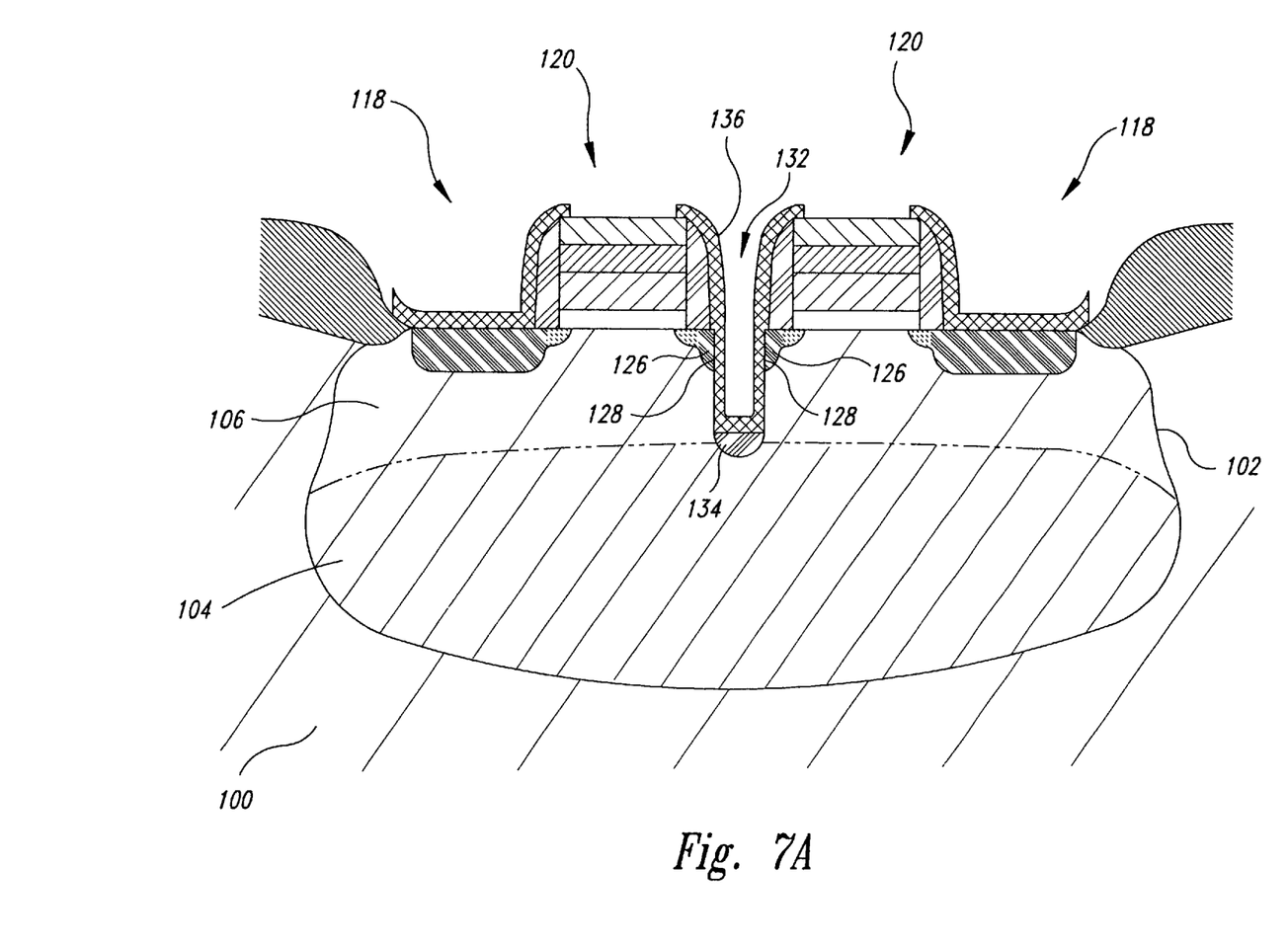
FIG. 7A shows a first alternate embodiment of the structure of FIG. 7.
Figure 7B:
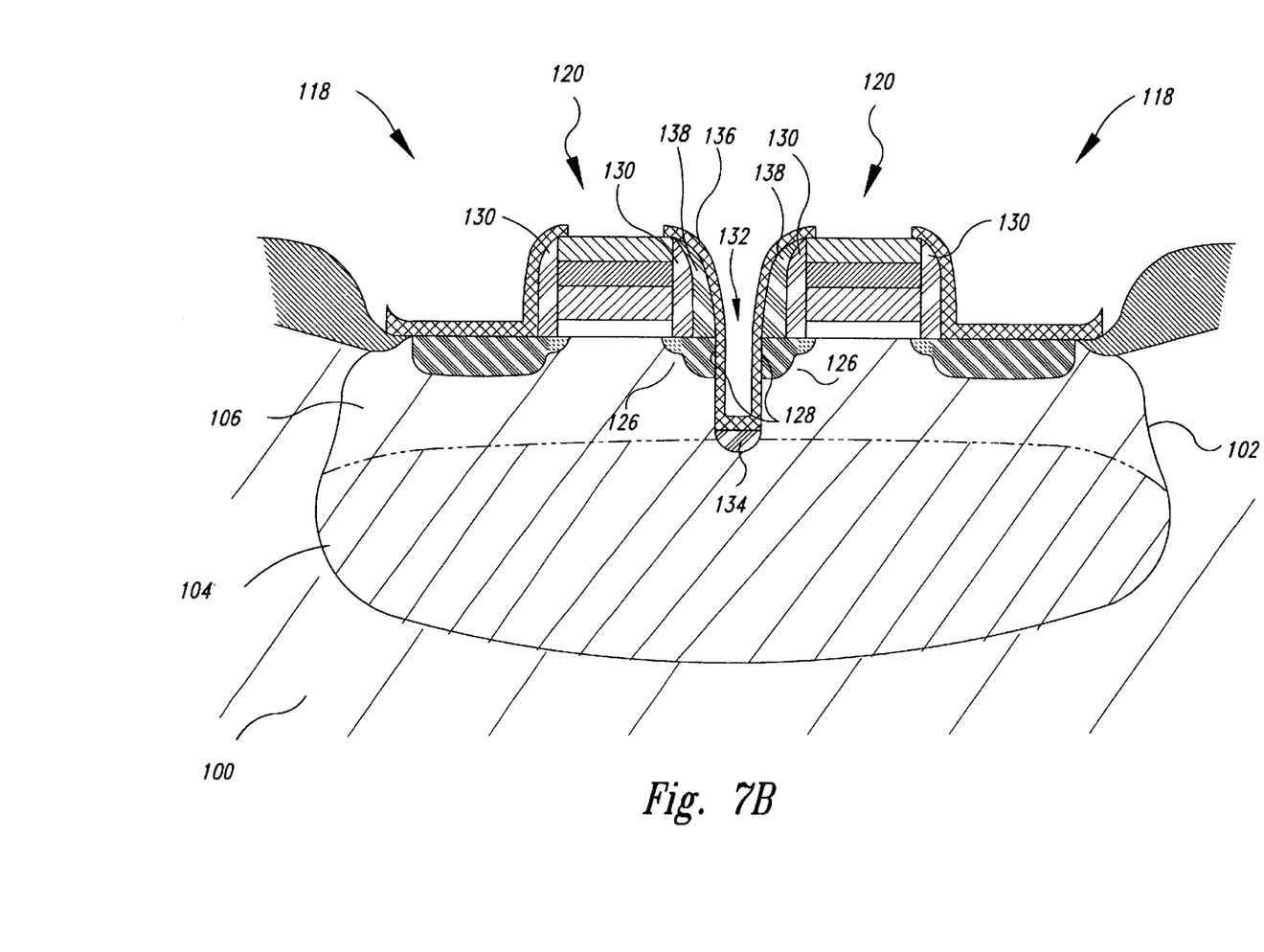
FIG. 7B shows a second alternate embodiment of the structure of FIG. 7.
Figure 7C:
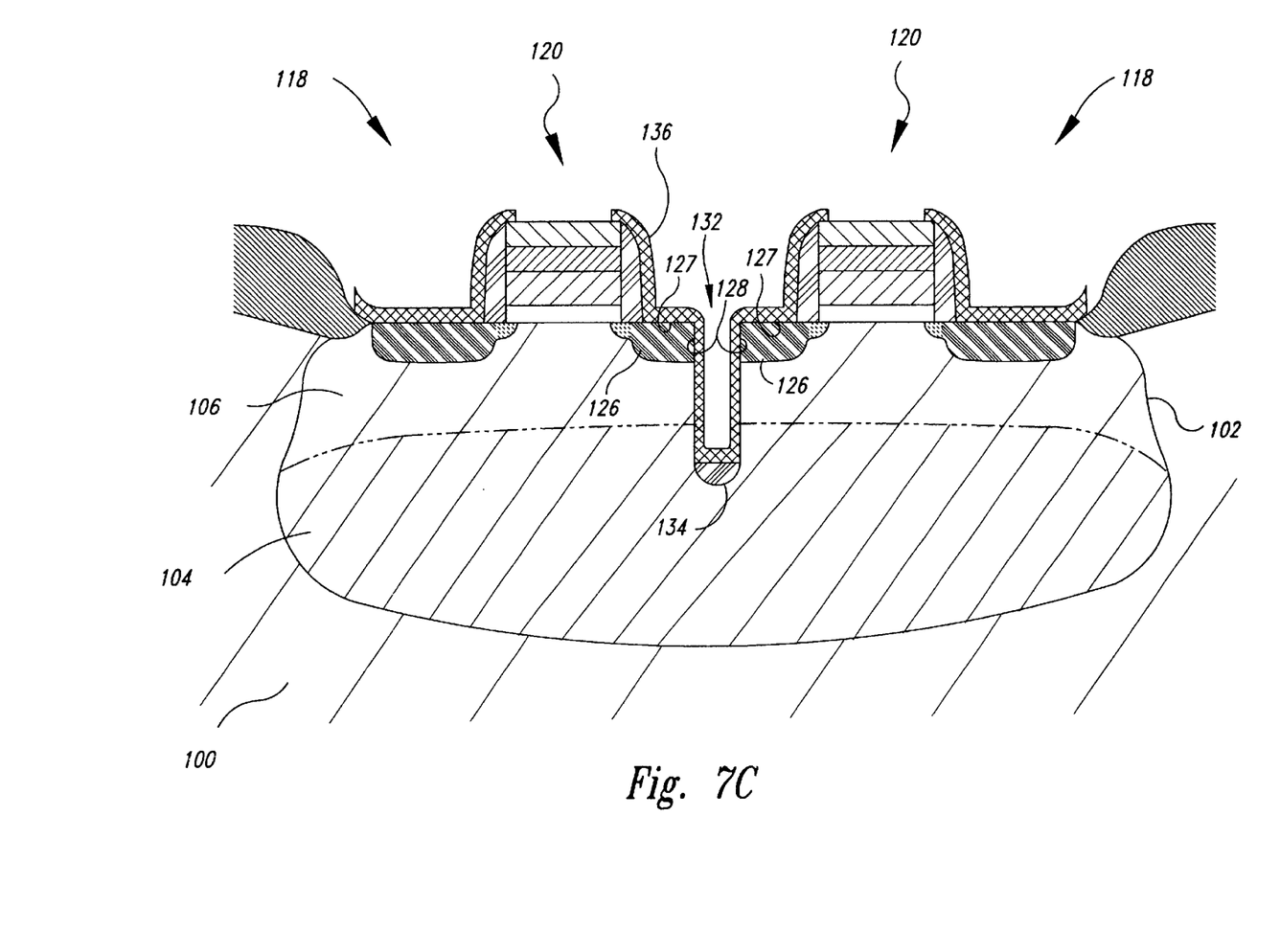
FIG. 7C shows a third alternate embodiment of the structure of FIG. 7.

FIG. 7A shows a first alternate embodiment wherein the upper surface portions 127 of the source 126 of FIG. 7 are absent. The embodiment of FIG. 7A thus allows for more compact integrated circuit design, but with a potential disadvantage, given integrated circuit processing tolerances, of leaving behind too little source region 126 for effective circuit operation in some applications. However, providing contact solely to the lateral surface portions 128 of a small source region 126, as provided by the embodiment of FIG. 7A, is acceptable in many circuit structures. A second alternate embodiment, depicted in FIG. 7B, has a second set of sidewall spacers 138 to augment the first sidewall spacers 130 and preserve a larger portion of the source region 126. The second sidewall spacers 138 are formed by the same techniques as the first sidewall spacers 130, such formation of sidewall spacers being known in the art. FIG. 7C shows a third alternate embodiment where the trench 132 is more deeply cut to a region within the buried layer 104, thereby increasing the assurance that the local interconnect 136 successfully connects the source 126 to the buried layer.

Because the buried layer 104 is heavily doped, it is capable of carrying currents with little resistance and therefore is used in lieu of a metal or other conducting layer for purposes of providing an electric potential supply or voltage source to an integrated circuit. In the above discussion, the fabrication of an N-channel enhancement-type MOSFET device has been described wherein the source region 126 is electrically connected to a buried layer 104 of low resistivity. A large number of such transistors could be so constructed, each with electrical connection between its respective source region and the underlying buried layer 104 common to all. Hence, connecting the buried layer 104 to ground potential as the voltage source or to $V_{SS}$ saves the cell area consumption associated with connecting ground lines from an upper layer down to the substrate and transistors throughout the integrated circuit. If the conductivity types are reversed in the above discussion, electrical contact between the source regions of P-channel MOSFETs and a conductive buried N-type layer allows for positive supply voltage or $V_{CC}$ to be supplied to transistors throughout the circuit without metal or other conductive layer connections.

Figure 8:
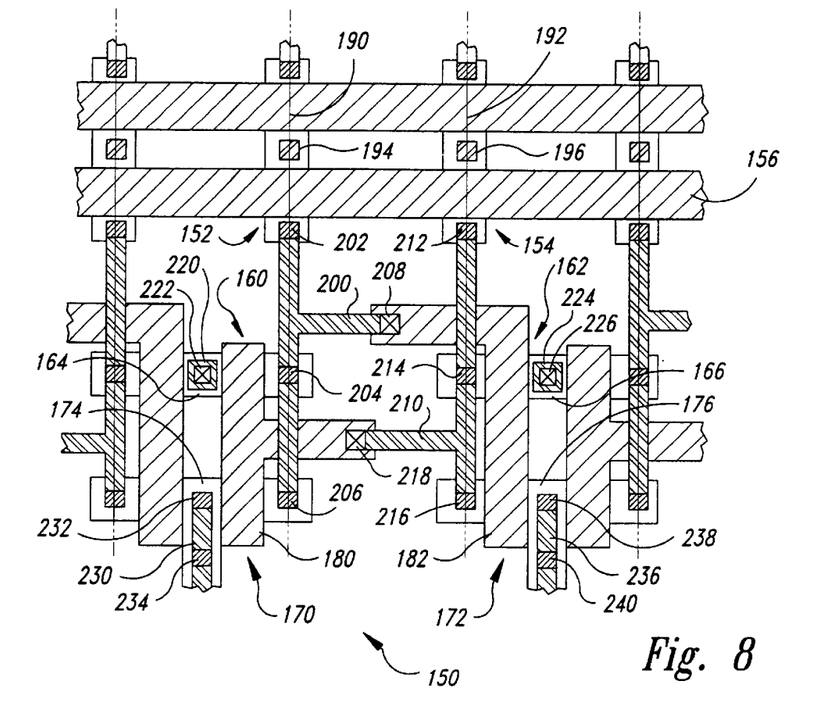
FIG. 8 is a top view of a portion of a memory cell layout configuration made according to the present invention.
Figure 8A:
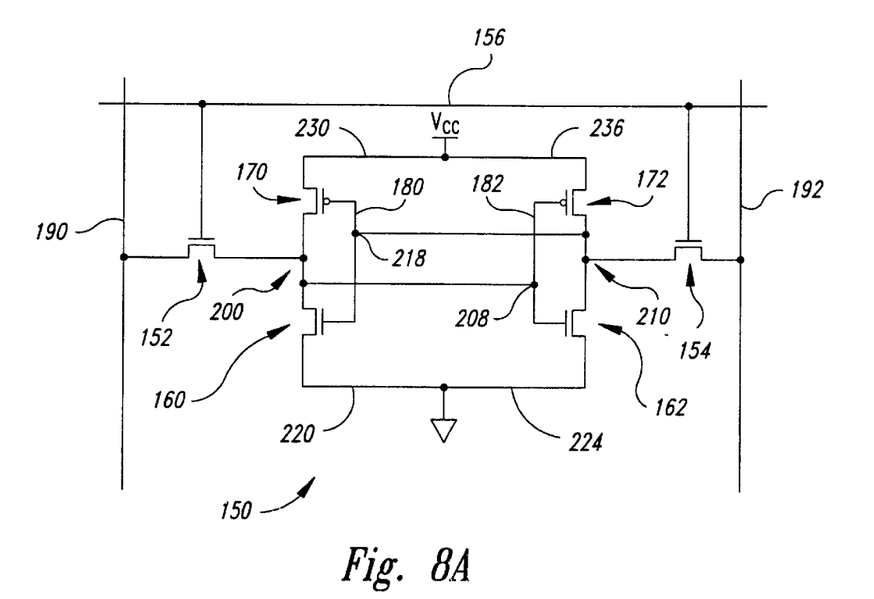
FIG. 8A is an electric schematic diagram of a single memory cell of FIG. 8.

One important application of the local ground connection taught by the present invention is in a 6-T SRAM memory cell array, a portion of which is depicted in FIG. 8 and can more easily be understood by cross-reference with the electric schematic diagram of FIG. 8A. A memory cell 150 includes first and second access transistors 152 and 154, first and second pulldown transistors 160 and 162, and first and second load transistors 170 and 172. Transistors 152, 154, 160 and 162 are preferably N-channel transistors and constructed in a retrograde P-well or P-type substrate having a retrograde dopant concentration, whereas transistors 170 and 172 are preferably P-channel devices constructed in an adjacent retrograde N-well.

The access transistors 152 and 154 have a common gate or word line 156 and are respectively connected to I/O or bit lines 190 and 192 at electrical contacts 194 and 196. The first pulldown transistor 160 and first load transistor 170 have a first common control terminal or gate 180, and the second pulldown transistor 162 and second load transistor 172 have a second common control terminal or gate 182. A first electrical connection or local interconnect 200 electrically couples first access transistor 152 at diffusion contact 202, first pulldown transistor 160 at diffusion contact 204, first load transistor 170 at diffusion contact 206 and the second common gate 182 at a first buried contact 208. A second local interconnect 210 electrically couples second access transistor 154 at diffusion contact 212, second pulldown transistor 162 at diffusion contact 214, second load transistor 172 at diffusion contact 216 and the first common gate 180 at a second buried contact 218.

A third local interconnect 220 connects a source region 164 of the first pull down transistor 160 to ground potential or $V_{SS}$ via a local trench contact 222 of the configuration described above and depicted in FIG. 7. Similarly, a fourth local interconnect 224 connects a source region 166 of the second pulldown transistor 162 to ground potential or $V_{SS}$ via a local trench contact 226. A fifth local interconnect 230 connects to a source region 174 of the first load transistor 170 at diffusion contact 232, and couples this source to supply potential or $V_{CC}$ at diffusion contact 234. A sixth local interconnect 236 connects to a source region 176 of the second load transistor 172 at diffusion contact 238, and couples this source to supply potential or $V_{CC}$ at diffusion contact 240.

The localized connection to ground potential taught by the present invention saves significant cell area that would otherwise be consumed by prior art connection to ground, thereby allowing increased cell density and the advantages associated therewith. Although not depicted in FIG. 8, connection of the sources 174 and 176 of load transistors 170 and 172, respectively, to $V_{CC}$ could also be accomplished with local trench contacts. However, the presently preferred embodiment of a 6-T SRAM memory cell array does not include a local trench contact to $V_{CC}$ for reasons described below.

Figure 8B:
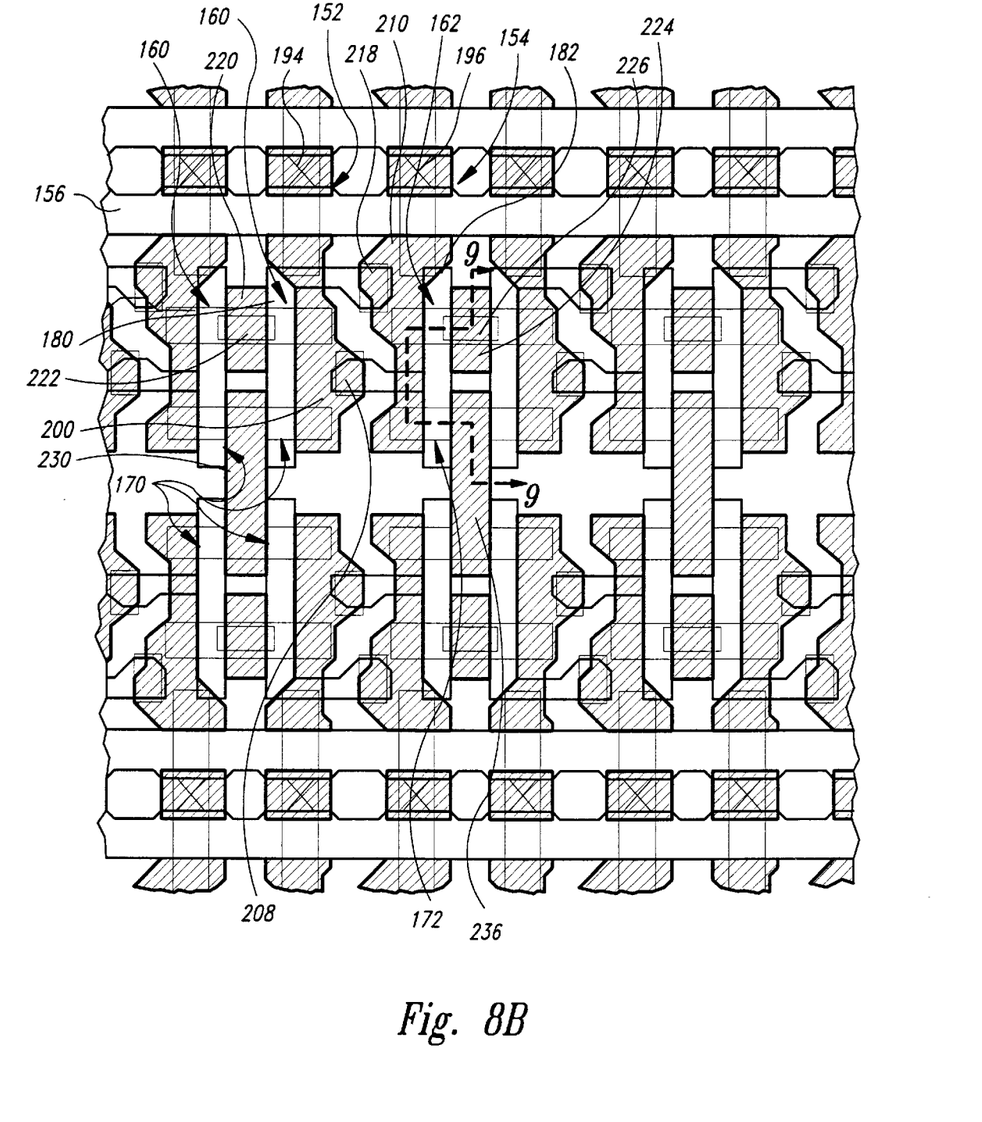
FIG. 8B shows an alternate embodiment of the memory cell layout configuration of FIG. 8.

FIG. 8B shows an embodiment of a 6-T SRAM memory cell layout that is more complete than the partly schematic representation of FIG. 8, provided for ease of understanding. As a particular example, the local interconnect material 200, 210, 220, 224, 230 and 236 shown in FIG. 8B occupies proportionately more space than depicted in FIG. 8, and completely covers the coupled active areas rather than making the particular discrete diffusion contacts depicted in FIG. 8. FIG. 8B also demonstrates why in the preferred embodiment a local trench contact to $V_{CC}$ does not save as significantly on cell area consumption as does a local trench to $V_{SS}$—namely, four P-channel load transistors 170 share a common source and all are conveniently connected to $V_{CC}$ by a diffusion contact, whereas only two N-channel pulldown transistors 160 share a common source and are more optimally connected to $V_{SS}$ according to the trench contact of the present invention. Of course, a trench type contact could be used for the P-channel transistors 170 if desired.

Figure 9:
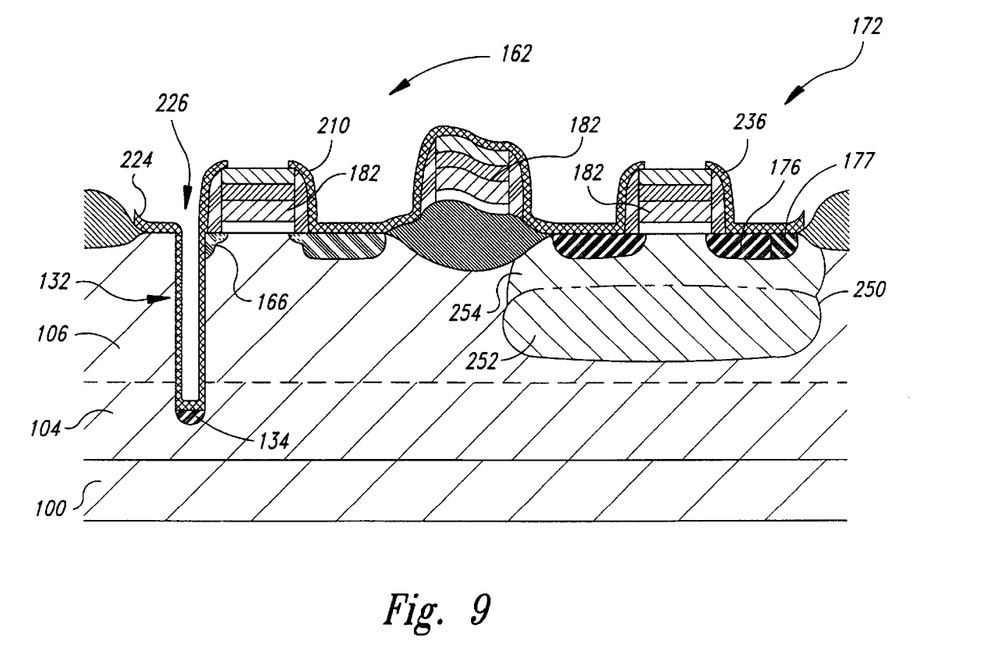
FIG. 9 is an enlarged cross-sectional view of a portion of the memory cell layout configuration of FIG. 8B, showing a CMOS inverter made according to the present invention.
Figure 9A:
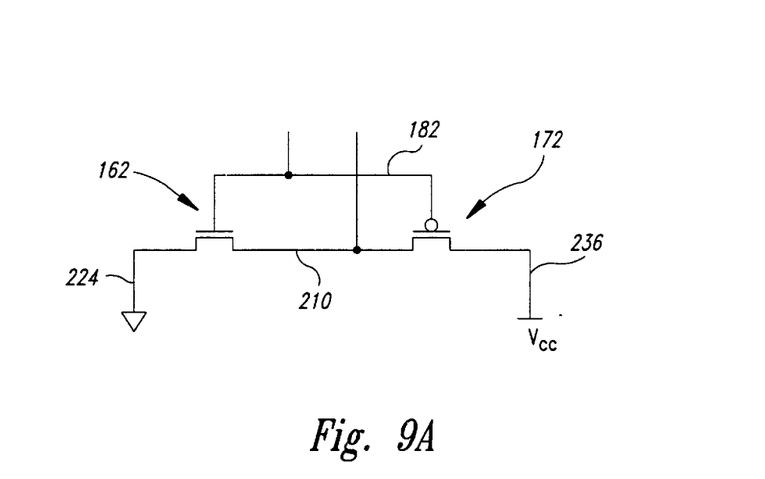
FIG. 9A is an electric schematic diagram of the CMOS inverter structure of FIG. 9, showing electric connections to ground and supply potentials.

As best seen by reference to the schematic diagram of FIG. 8A, memory cell 150 includes two cross-coupled CMOS inverters, each formed by a respective P-channel load transistor 170 and 172 and an N-channel pulldown transistor 160 and 162. FIG. 9 shows a cross-sectional view of one of these CMOS inverters (a top view of which is provided in FIG. 8B).

In FIGS. 1–7 and the accompanying discussion above, a retrograde P-well 102 was formed in substrate 100 and included a buried layer 104 and an upper region 106. FIG. 9 shows the presently preferred mode of practicing the present invention for a CMOS inverter, where buried layer 104 and upper region 106 are global to the entire substrate 100. A retrograde N-well 250 is formed within the upper region 106 by manner similar to formation of the P-well 102 described above—namely, implantation and anneal of high and low energy doses of an N-type dopant such as arsenic or phosphorous. The N-well 250 includes a lower well region or buried layer 252 of approximate dopant concentration $10^{18}$–$10^{19}$/cm$^3$, and an upper well region 254 of approximate dopant concentration $10^{16}$–$10^{17}$/cm$^3$.

The P-channel transistor 172 is formed within the N-well 250 by means well known to the art and by process steps similar to fabrication of the N-channel transistors discussed above. Adjacent the source region 176 is a diffusion region 177 doped N-type which provides the coupling of the source 176 of the P-channel load transistor 172 to the lower well region 252 via local interconnect 236. The N-channel transistor 162 and trench 132 are formed by process steps depicted in FIGS. 1–6, 7B & 7C and described in the accompanying text. In accordance with the present invention, significant cell area consumption is avoided by locally connecting the source 166 of the transistor 162 to the buried layer 104 via local interconnect 224 and trench contact 226.

Because buried layers 104 and 252 are each heavily doped, each is capable of carrying currents with little resistance and therefore acts in lieu of a metal or other conducting layer for purposes of powering the CMOS inverter. Buried layer 104 is therefore connected to $V_{SS}$ and buried layer 252 is connected to $V_{CC}$. Although not depicted in the FIG. 9 CMOS inverter cross-section or in the cell layout depiction of FIGS. 8 and 8B, it is currently preferred that $V_{CC}$ and $V_{SS}$ will be provided by metal strap or other conventional techniques known to the art approximately every 16 memory cells, thereby avoiding any problems associated with substrate loading.

Figure 10:
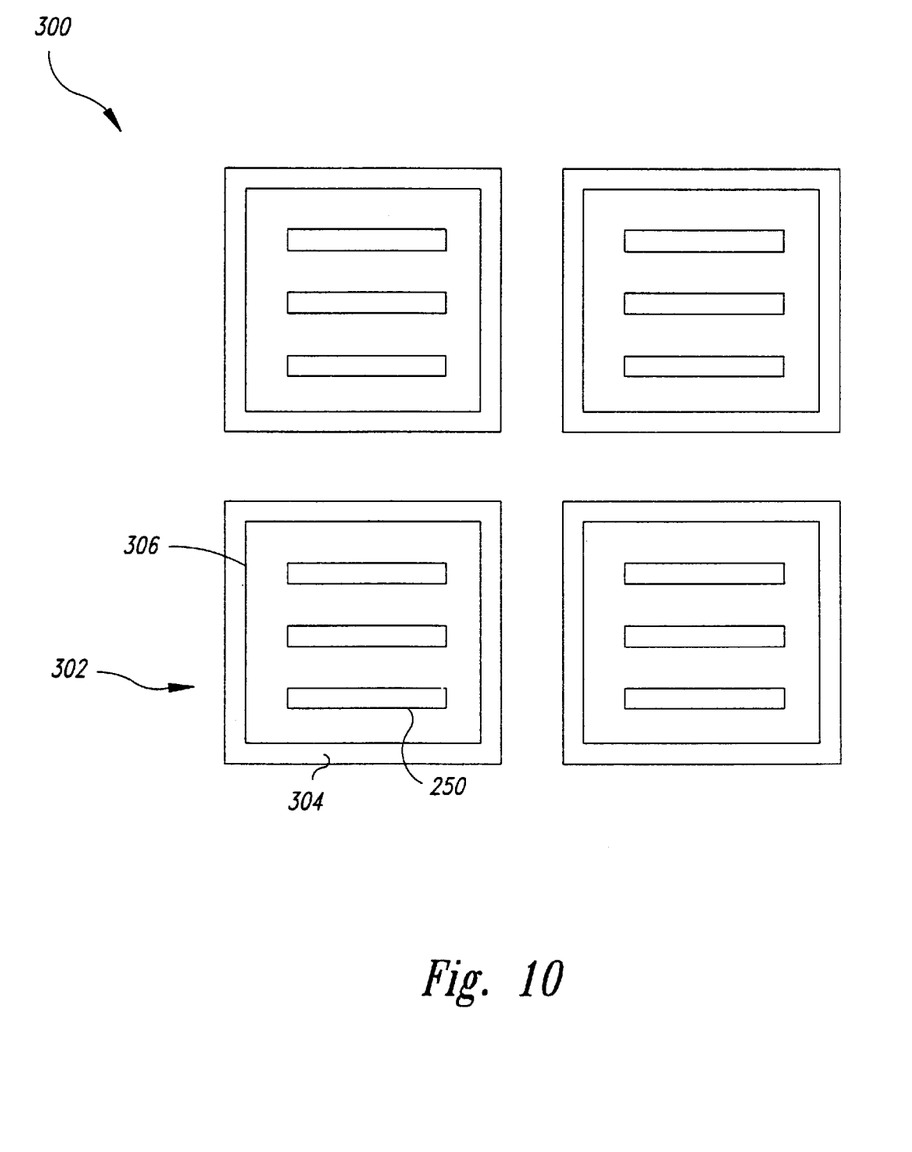
FIG. 10 is a top view of a memory cell array made according to the present invention.

Referring to FIG. 10, a memory array 300 includes four memory sub-arrays 302, each of which includes a ground shield 304 surrounding the cell layout area 306. Area 306 includes within it numerous CMOS memory cells like that depicted in FIGS. 8–8B and described above. The P-channel load transistors are formed within the N-wells 250 (only three of which are shown per sub-array 302 for purposes of simplicity) and the N-channel access and pulldown transistors are formed outside the N-wells. The trench contact 226 to ground (see FIG. 9) lends itself particularly well to the memory array configuration of FIG. 10, since any one memory cell has less than one square sheet resistance between the trench contact 226 with the buried layer 104 and the ground shield 304 surrounding each sub-array 302. Preferably, a metal line for $V_{SS}$ is provided to the ground shield 304 to provide a high current carrying member to ground.

It will be appreciated that, while various embodiments of the present invention has been described for purposes of illustration, modifications may be made without departing from the spirit and scope of the invention. For example, application of the present invention to a static random access memory device has been described in some detail, whereas the present invention will find advantageous use in any integrated circuit where minimizing consumption of otherwise active area is important. The trench contact structure may be used on the same chip in combination with traditional circuit powering techniques, as for example where active area preservation is not so important in peripheral circuits to the area-precious memory array. Accordingly, the invention is not limited by the disclosure, but instead its scope is to be determined by reference to the following claims.

What is claimed is:

1. An integrated circuit, comprising:
   a semiconductor substrate;
   a surface region of a first conductivity type in said semiconductor substrate;
   a buried region of a second conductivity type in said substrate, below said surface region;
   an intermediate region of the second conductivity type positioned between said surface region and said buried region in said substrate, and having a lesser conductivity than said buried region; and
   an electrical conductor extending from said surface region through said intermediate region and into said buried region and electrically connecting said surface region with said buried region.

2. The integrated circuit described in claim 1, wherein said buried region is connected to an electric potential supply.

3. The integrated circuit described in claim 2, further comprising:
   a second surface region of the second conductivity type in said semiconductor substrate;
   a second buried region of first conductivity type in said substrate;
   a second intermediate region of the first conductivity type positioned between said second surface region and said second buried region in said substrate, and having a lesser conductivity than said second buried region;
   a second electrical conductor extending from said second surface region through said second intermediate region and into said second buried region and electrically connecting said second surface region with said second buried region; and
   a second electric potential supply connected to said second buried region, said first and second electric potential supplies powering the integrated circuit.

4. The integrated circuit described in claim 2, wherein said surface region contains an input/output terminal of a switching device.

5. The integrated circuit described in claim 2, further comprising:
   a well region of the first conductivity type in the semiconductor substrate, said well region including a well surface region of the second conductivity type, a well buried region of the first conductivity type, and a well intermediate region of the first conductivity type with lesser conductivity than the well buried region;
   an electrical connection between the well surface region and the well buried region; and
   a second electric potential supply connected to the well buried region, said first and second electric potential supplies powering the integrated circuit.

6. An integrated circuit, comprising:
   a semiconductor substrate;
   an upper region of a first conductivity type in said substrate, said upper region of a selected conductivity;
   a lower region of the first conductivity type in said substrate, said lower region of higher conductivity than said upper region;
   first and second switching devices having a common input/output terminal located in a surface region of said upper region, the surface region being of a second conductivity type;
   a local interconnect extending from the surface region through said upper region to said lower region to electrically connect the common input/output terminal to said lower region; and
   an electric potential supply electrically connected to said lower region.

7. An integrated circuit, comprising:
   a first well region of a first conductivity type in a semiconductor substrate, said first well including a first upper region of a selected conductivity and a first lower region of higher conductivity than the first upper region;
   a second well region of a second conductivity type in the semiconductor substrate; said second well including a second upper region of a selected conductivity and a second lower region of higher conductivity than the second upper region;
   a first switching device in said first well region, said first switching device having an input/output terminal located in a first surface region of the first upper region, the first surface region being of the second conductivity type, a first local interconnect extending between the first surface region and the first lower region to electrically connect the input/output terminal to the first lower region;
   a second switching device in said second well region, said second switching device having an input/output terminal located in a second surface region of the second upper region, the second surface region being of the first conductivity type, a second local interconnect extending between the second surface region and the second lower region to electrically connect the input/output terminal to the second lower region; and
   first and second electric potential supplies electrically connected to the first lower region of said first well and the second lower region of said second well, respectively.

8. A semiconductor memory device, comprising:
   a first well region of a first conductivity type in a semiconductor substrate, said first well including a first upper region of a selected conductivity and a first lower region of higher conductivity than the first upper region;
   a second well region of a second conductivity type in the semiconductor substrate; said second well including a second upper region of a selected conductivity and a second lower region of higher conductivity than the second upper region;
   first and second transistors in said first well region, said transistors having a common source located in a first surface region of the first upper region, the first surface region being of the second conductivity type, a first local interconnect extending between the first surface region and the first lower region to electrically connect the common source to the first lower region;

third and fourth transistors in said second well region, said third and fourth transistors having a common source located in a second surface region of the second upper region, the second surface region being of the first conductivity type, a second local interconnect extending between the second surface region and the second lower region to electrically connect the common source to the second lower region; and first and second electric potential supplies electrically connected to the first lower region of said first well and the second lower region of said second well, respectively.

9. The memory device described in claim 8, wherein said first and third transistors have a first common gate, and said second and fourth transistors have a second common gate.

10. The memory device described in claim 9, further comprising a third local interconnect electrically coupling said first and third transistors, and a fourth interconnect electrically coupling said second and fourth transistors.

11. The memory device described in claim 10, wherein said third interconnect electrically contacts the second common gate, and said fourth interconnect electrically contacts the first common gate.

12. A semiconductor memory device, comprising:

a semiconductor substrate having an upper region of a first conductivity type and a lower region of the first conductivity type, the upper region of a selected conductivity and the lower region of higher conductivity than the upper region;

a well region of a second conductivity type in said semiconductor substrate; said well including a well upper region of a selected conductivity and a well lower region of higher conductivity than the well upper region;

first and second switching devices having a common input/output terminal located in a surface region of the upper region, the surface region being of the second conductivity type, a first electrical connection extending between the surface region and the lower region to electrically connect the input/output terminal to the lower region;

third and fourth switching devices having a common input/output terminal located in a well surface region of the well upper region, the well surface region being of the first conductivity type, a second electrical connection between the well surface region and the well lower region to electrically connect the input/output terminal to the well lower region; and first and second electric potential supplies electrically connected to the lower region of said substrate and the well lower region of said well, respectively.

13. The memory device described in claim 12, wherein said first and third switching devices have a first common control terminal, and said second and fourth switching devices have a second common control terminal.

* * * * *